(12) United States Patent
Gemmill et al.

(10) Patent No.: US 9,327,966 B2
(45) Date of Patent: May 3, 2016

(54) SEMI-AQUEOUS POLYMER REMOVAL COMPOSITIONS WITH ENHANCED COMPATIBILITY TO COPPER, TUNGSTEN, AND POROUS LOW-K DIELECTRICS

(75) Inventors: William R. Gemmill, Bethlehem, PA (US); Glenn Westwood, Edison, NJ (US)

(73) Assignee: AVANTOR PERFORMANCE MATERIALS, INC., Center Valley, PA (US)

( * ) Notice: Subject to any disclaimer, the term of this patent is extended or adjusted under 35 U.S.C. 154(b) by 0 days.

(21) Appl. No.: 14/122,793

(22) PCT Filed: May 31, 2012

(86) PCT No.: PCT/US2012/040187
§ 371 (c)(1),
(2), (4) Date: May 8, 2014

(87) PCT Pub. No.: WO2012/166902
PCT Pub. Date: Dec. 6, 2012

(65) Prior Publication Data
US 2014/0248781 A1     Sep. 4, 2014

Related U.S. Application Data

(60) Provisional application No. 61/519,902, filed on Jun. 1, 2011.

(51) Int. Cl.
| | |
|---|---|
| *H01L 21/302* | (2006.01) |
| *H01L 21/461* | (2006.01) |
| *C09K 13/00* | (2006.01) |
| *C09K 13/02* | (2006.01) |
| *B81C 1/00* | (2006.01) |
| *C11D 3/00* | (2006.01) |
| *C11D 3/20* | (2006.01) |
| *C11D 3/28* | (2006.01) |
| *C11D 3/30* | (2006.01) |
| *C11D 11/00* | (2006.01) |
| *G03F 7/42* | (2006.01) |
| *H01L 21/02* | (2006.01) |
| *H01L 21/311* | (2006.01) |
| *C08J 7/12* | (2006.01) |

(52) U.S. Cl.
CPC ............... *B81C 1/00539* (2013.01); *C08J 7/12* (2013.01); *C09K 13/00* (2013.01); *C11D 3/0073* (2013.01); *C11D 3/2044* (2013.01); *C11D 3/2058* (2013.01); *C11D 3/2068* (2013.01); *C11D 3/28* (2013.01); *C11D 3/30* (2013.01); *C11D 11/0047* (2013.01); *G03F 7/425* (2013.01); *H01L 21/02057* (2013.01); *H01L 21/31133* (2013.01)

(58) Field of Classification Search
None
See application file for complete search history.

(56) References Cited

U.S. PATENT DOCUMENTS

| | | | |
|---|---|---|---|
| 2006/0237392 A1* | 10/2006 | Auger et al. | 216/83 |
| 2007/0003884 A1 | 1/2007 | Sakai et al. | |
| 2007/0060490 A1* | 3/2007 | Skee | 510/175 |

(Continued)

*Primary Examiner* — Stephanie Duclair
(74) *Attorney, Agent, or Firm* — Hoffmann & Baron, LLP (57) ABSTRACT

A composition is provided that is effective for removing post etch treatment (PET) polymeric films and photoresist from semiconductor substrates. The composition exhibits excellent polymer film removal capability while maintaining compatibility with copper and low-κ dielectrics and contains water, ethylene glycol, a glycol ether solvent, morpholinopropylamine and a corrosion inhibiting compound and optionally one or more metal ion chelating agent, one or more other polar organic solvent, one or more tertiary amine, one or more aluminum corrosion inhibition agent, and one or more surfactant.

29 Claims, 4 Drawing Sheets

(56) References Cited

U.S. PATENT DOCUMENTS

| | | |
|---|---|---|
| 2007/0149430 A1 | 6/2007 | Egbe et al. |
| 2008/0261847 A1* | 10/2008 | Visintin et al. ............... 510/176 |
| 2009/0215658 A1* | 8/2009 | Minsek et al. ............... 510/175 |
| 2010/0152086 A1* | 6/2010 | Wu ..................... C11D 3/0073 510/175 |

* cited by examiner

SEMI-AQUEOUS POLYMER REMOVAL COMPOSITIONS WITH ENHANCED COMPATIBILITY TO COPPER, TUNGSTEN, AND POROUS LOW-K DIELECTRICS

This application is the U.S. National Phase of, and Applicants claim priority from International Patent Application Number PCT/US2012/040187 filed 31 May 2012, which claims priority from Provisional Application 61/519,902 filed 1 Jun. 2011, each of which is incorporated herein by reference.

FIELD OF THE INVENTION

The invention relates to a microelectronics cleaning/removal composition and the use thereof for removing post etch treatment (PET) polymeric films and photoresist and post etch ash residue from semiconductor substrates. The composition exhibits excellent polymer film removal capability while maintaining compatibility with copper, tungsten and low-κ dielectrics. The cleaning/removal composition can neither etch nor damage the porous low-κ dielectric and be compatible with tungsten and titanium nitride.

BACKGROUND OF THE INVENTION

Semiconductor devices have been produced by the steps of coating an inorganic substrate with a photoresist; patterning the photoresist film by exposure to light and subsequent development; etching exposed region of the inorganic substrate using the patterned photoresist film as a mask to form minute circuits; and removing the patterned photoresist film from the inorganic substrate. Alternatively, after forming minute circuits in the same manner as above, the patterned photoresist film is ashed, and then the remaining resist residues are removed from the inorganic substrate.

In advanced integration, beyond the 22 nm node technology, a metal hard mask may be employed to aid in the fabrication of the device architecture. The hard mask is typically composed of Ti or TiN and provides dry etch selectivity and protection for any underlying, relatively sensitive, low-κ dielectric material, especially porous low-κ dielectric material. One disadvantage of this process it that the resulting etch residue can be very difficult to remove as it is composed of relatively insoluble inorganic polymers of $TiO_xF_y$. The primary method of removing these polymer compounds has been to use a dilute HF based cleaning formulation. The use of such a dilute HF based cleaning formulation will often result in damage to the sensitive porous low-κ dielectric and any densified silicon dioxide material on or around the low-κ dielectric or at the interface of the TiN and low-κ dielectric which results in delaminating of TiN. In order to prevent the formation of these inorganic residues a polymeric film can be applied to the substrate using a post-etch plasma treatment, such as for example, a $CH_4$ plasma treatment, as described by O. Jourbert, N. Posseme, T. Chevolleau, T. David, M. Damon, UCPSS (September 2010) Ostend, Belgium; Q. T. Le, F. Drieskens, J. F. de Marneffe, T. Conard, m. Lux, H. Struyf, G. Vereecke, UCPSS (September 2010) Ostend, Belgium.; and N. Posseme, R. Bouyssou, T. Chevolleau, T. David, V. Arnal, S. Chhun, C, Monget, E. Richard, D. Galpin, J. Guillan, L. Arnaud, D. Roy, M. Guillermet, J. Ramard, O. Joubert, C. Verove, IITC (2009) Sapporo, Hokkaido, Japan. This polymeric film essentially eliminates the occurrence of the $TiO_xF_y$ type residue. However, the post etch treatment (PET) polymeric film must be removed after the etch process and before any subsequent metallization can occur.

Porous low-κ dielectric development has progressed significantly in recent years. General definitions of dielectrics include low-κ dielectrics with κ values less than 3.0 and ultra low-κ dielectrics with κ values less than 2.5. Ultra low-κ dielectric materials are highly porous in nature and more susceptible to damage from chemical treatment either by direct attack of the material's structural framework resulting in etching or by chemical penetration into the pores of the material destroying its insulating properties.

There is a therefore a need to provide a cleaning solution for removing PET polymer film and residue while not damaging any underlying dielectric layer, especially low-κ dielectric materials, or metallization of the device. It is particularly desirable to provide a cleaning composition for removing etch/ash residue, photoresist, and PET polymer while not damaging underlying porous low-κ dielectric layer or the metallization, particularly copper and tungsten.

The improved solution must possess the ability to remove polymeric films and residue from the surface, be as benign as possible to copper metal (etch rate <1.0 Å/min), can neither etch nor damage the porous low-κ dielectric (determined by refractive index and κ value shift), and must be compatible with tungsten and titanium nitride.

SUMMARY OF THE INVENTION

The PET polymer removal compositions of this invention are semi-aqueous, basic in pH with a pH of >9 (5% solution diluted in water), solvent and amine containing compositions and comprises, consists essentially of, or consists of water, ethylene glycol, one or more glycol ether solvent, morpholinopropylamine, a corrosion inhibiting compound that is methylbenzotriazole or tolyltriazole, and optionally one or more other organic polar solvents, one or more metal ion chelating compound, one or more tertiary amine, one or more of catechol or alkyl substituted catechol as an aluminum corrosion inhibitor, and one or more surfactant. The compositions of this invention may be employed to clean microelectronic substrates to remove photoresist, etch residue and PET polymer, especially from those microelectronics substrates containing TiN hard masks, porous low-κ dielectric films, and copper or tungsten metallization. To accomplish cleaning of the microelectronic substrates or devices the microelectronic substrates are contacted with the compositions of this invention for a time and at a temperature sufficient to accomplish such cleaning according to procedures well know in the art.

DETAILED DESCRIPTION OF THE INVENTION

The PET polymer removal compositions of this invention are semi-aqueous, basic in pH, solvent and amine containing compositions and comprises, consists essentially of, or consists of water, ethylene glycol, one or more glycol ether solvent, morpholinopropylamine, a corrosion inhibiting compound that is methylbenzotriazole or tolyltriazole, and optionally one or more other organic polar solvents, one or more metal ion chelating compound, one or more tertiary amine, and one or more surfactant. These removal compositions have a pH of >9 (5% formulation diluted in water) and will contain from about 5% to about 40% by weight water, about 30% to about 70% by weight of one or more glycol ether solvent, about 0.5% to about 20% by weight morpholinopropylamine, about 2% to about 20% by weight ethylene glycol, about 0.1% to about 0.5% by weight of a corrosion inhibiting compound that is selected from methylbenzotriazole or tolyltriazole, optionally 5% to about 40% by weight of one or more of other polar organic solvent, optionally about 2% to about 12% by weight of one or more tertiary amine, optionally about 0.01% to about 1% by weight of one or more metal ion chelating compound, optionally about 0.01% to about 10% by weight of one or more of catechol or alkyl substituted catechol as an aluminum corrosion inhibitor, and optionally 0.01%-1% by weight of one or more surfactant compound.

Any suitable glycol ether compound may be employed in the compositions of this invention. Suitable glycol ethers include, but are not limited to, ethylene glycol methyl ether, ethylene glycol ethyl ether, ethylene glycol butyl ether, diethylene glycol methyl ether, diethylene glycol ethyl ether, diethylene glycol butyl ether, diethylene glycol propyl ether, triethylene glycol methyl ether, triethylene glycol ethyl ether, triethylene glycol butyl ether and mixtures thereof. The amount of glycol ether component present in the cleaning compositions of this invention will generally be in the range of form about 30% to about 70% by weight of the composition, preferably from about 35% to about 65%, and more preferably form about 40% to about 65%.

While the ethylene glycol component may be present in the removal composition in an amount of from about 2% to about 20% by weight, a preferred amount is from about 3% to about 15%, and even more preferred in an amount of from about 5% to about 10%.

The water component of the removal composition will generally be present in the removal composition in an amount of from about 5% to about 40% by weight, preferably from about 10% to about 30%, more preferably about 15% to 25%, and still more preferably about 20%.

The corrosion inhibitor in the removal composition of this invention is used to reduce the copper etch rate and include methyl benzotriazole, particularly 5-methylbenzotriazole or 4-methylbenzotriazole, or tolyltriazole. Benzotriazole itself cannot be used in these formulations as will be seen from the data and explanation hereinafter.

Morpholinopropylamine will be present in the removal compositions generally in an amount of from about 0.5% to about 20% by weight, preferably from about 0.5% to about 15%, more preferably from about 1% to about 10%. The morpholinopropylamine is most preferably 3-morphlinopropylamine.

Any suitable metal ion chelating compound may optionally, but is preferably, also included in the removal composition. When present, the metal ion chelating compound will generally be present in the removal composition in an amount of from about 0.01% to about 1% by weight, preferably from about 0.05% to 1%, and more preferably from about 0.1% to about 0.5%, most preferably from about 0.1% to about 0.2%. Examples of suitable metal ion chelating agents include, but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties e.g., ethylenediamine tetra(methylene phosphonic acid) (EDTMP), diethylenetriamine penta(methylene phosphonic acid), and triethylenetetramine hexa(methylene phosphonic acid), and mixtures thereof.

Any other suitable polar organic solvent may optionally be employed in the compositions of this invention. Suitable polar solvents include, but are not limited to, sulfolane, N-methyl-1-pyrolidinone; dimethyl sulfoxide, dimethyl piperidone, 1-(2-hydroxyethyl)-2-pyrolidinone, and 1-methyl-2-pyrrolidinone and mixtures thereof. When such other organic polar solvent is present in the removal compositions of this invention they will generally be present in an amount of from 5% to about 40% by weight, preferably from about 10% to about 30%, and more preferably from about 15% to about 25% and most preferably about 20%.

When a tertiary amine component is included in the removal composition it is generally present in an amount of from about 2% to about 12% by weight, preferably from about 4% to about 10% and more preferably about 5% to about 7%, most preferably about 6%. Any suitable tertiary mine may be employed and includes, but is not limited to, triethanolamine, diethylethanolamine, methyldiethanolamine, pentamethyldiethylenetriamine, diethanolamine, hexamethylenetetramine and mixtures thereof.

When the microelectronic device to be cleaned by the cleaning compositions of this invention has aluminum present and is exposed to the cleaning composition it is desirable that one or more of catechol or alkyl substituted catechol be present in the cleaning composition of this invention as an aluminum corrosion inhibitor. Any suitable catechol or alkyl substituted catechol may be employed as the aluminum corrosion inhibitor. While any suitable alkyl catechol may be employed the alkyl group is preferably one containing from 1 to 4 carbon atoms. Suitable examples of such aluminum corrosion inhibitors include, but are not limited to, 3-methycatechol, 4-methyl catechol, 3-ethylcathechol, 4-ethylcayechol, 3-n-propylcatechol, 4-n-propylcatechol, and 4-t-butylcatechol. The aluminum corrosion inhibitor is preferably 4-t-butylcatechol. This optional aluminum corrosion inhibiting agent may be present in the compositions of this invention in an amount of from about 0.01% to about 10%, preferably from about 0.1% to about 7%, more preferably from about 0.5% to 5%, by weight of the composition.

Any suitable surfactant may be optionally employed in the removal compositions of this invention. Examples of suitable surfactant include, but are not limited to, acetylenic diol non-ionic surfactant such as Surfynol® 61, Surfynol® 465 from Air Products, non-ionic fluorosurfactants such as Zonyl® FSH from E.I. DuPont, and International Specialty Products' Surfadone® LP100 and Surfadone® LP300 surfactants. LP100 and LP-300 are structurally composed of a dipolar pyrrolidone ring with a hydrophobic alkyl group of either n-octyl (LP-100) or n-dodecyl (LP-300). The dipolar pyrrolidone ring surfactants are preferred. When the surfactants are present in the removal compositions they will generally be present in an amount of from about 0.01% to about 1% by weight, preferably from about 0.01 to about 0.5% and more preferably from about 0.01% to about 0.05%, most preferably at about 0.05%.

The use of solvent based cleaner compositions containing amine compounds have been in use extensively for the removal of polymer in the form of photoresist and/or residue. These formulations typically contain no water and are used in the production of semiconductors generally utilizing aluminum technology. The progression to copper technology limits the utility of such prior art cleaners as they will typically etch copper. Corrosion inhibitors are generally used to prevent damage to copper interconnects. As the demand for the reduction in solvent consumption and for more environmentally benign chemistry increases it has become incumbent on the formulator to pursue semi-aqueous chemistry. In the case of semi-aqueous formulations a corrosion inhibitor is required to maintain copper compatibility when a primary amine is present. Generally, this corrosion inhibitor is benzotriazole. Benzotriazole can be effective at relatively high concentrations of about 1 weight %, but at this concentration level the trace metal impurities from the raw material become problematic. The introduction of a benzotriazole as a copper corrosion inhibitor in this type of formulation has been discovered to yield a new problem in that an insoluble film of a polymeric Cu-BZT can deposit on the copper surface under certain circumstances. This is very undesirable as this will result in catastrophic failure of the circuit upon post cleaning copper deposition in the next step of the manufacturing process. It has not been apparent that a unique combination of a particular amine and low concentration of a particular corrosion inhibitor can yield a formulation that does not damage copper. The compositions of this invention utilize the unique combination of morpholinopropylamine (MPA) and methylbenzoltriazole (MBT) or tolyltriazole (TT) in semi-aqueous basic compositions containing ethylene glycol and a glycol ether solvent to solve this problem.

As specific examples of removal cleaning compositions of this invention there may be mentioned the following illustrative, but limiting examples of suitable compositions wherein the numerals represent percents by weight.

The thickness and refractive index (n) of the porous ultra low-κ dielectric film was determined by ellipsometry. The dielectric constant (κ) was determined using an Hg probe. Compositions 1, 2 and 3 in Table 2 are the compositions so designated in Table 1 wherein the compositions contain 5-MBT.

TABLE 2

| Material and (Metric measured) | Composition 1 | Composition 2 | Composition 3 |
|---|---|---|---|
| Copper (ER) | <1.0 | <1.0 | <1.0 |
| Porous low-κ (ER) | <1.0 | <1.0 | <1.0 |
| Porous low-κ (n-shift) | +0.00 | −0.04 | −0.02 |
| Porous low-κ (κ-shift) | +0.01 | −0.01 | −0.04 |
| Titanium nitride (ER) | <1.0 | <1.0 | <1.0 |
| Tungsten (ER) | 2.4 | 1.9 | 2.8 |

ER = etch rate in Å/min;
n-shift = refractive index change post processing;
κ-shift = dielectric constant change post process.

The uniqueness and non-obviousness of employing morpholinopropylamine in the removal compositions of this invention is illustrated by the following experiment. Using amine in a cleaning formulation greatly increases the polymer removal capability of the composition and in particular primary amines as they are more effective than secondary or tertiary amines in removing polymeric residue. The use of a primary amine in semi-aqueous formulations will result in copper corrosion. Therefore, a corrosion inhibitor is required to protect the copper surface from attack from either hydroxide ion (OH−) or the primary amine (NH$_2$R). The following experiment was performed using examples of primary and secondary amines and the copper etch rates was determined at

TABLE 1

| Components | Composition 1 | Composition 2 | Composition 3 | Composition 4 | Composition 5 | Composition 6 | Composition 7 |
|---|---|---|---|---|---|---|---|
| Water | 20.9 | 20.75 | 19.95 | 20.0 | 20.0 | 20.0 | 20.0 |
| NMP | 20.0 | 20 | — | 19.2 | 19.2 | 19.2 | 19.2 |
| EGBE | 46.5 | 46.5 | 60.7 | 44.7 | 44.7 | 44.7 | 44.7 |
| EG | 5 | 5 | 10 | 4.8 | 4.8 | 4.8 | 4.8 |
| MPA | 1.5 | 1.5 | 9 | 1.4 | 1.4 | 1.4 | 1.4 |
| 5-MBT or TT | 0.1 | 0.1 | 0.2 | 0.11 | 0.1 | 0.1 | 0.1 |
| CyDTA | — | 0.2 | 0.1 | — | — | — | — |
| LP-300 | — | 0.05 | 0.05 | — | — | — | — |
| TEA | 6 | 6 | — | 5.8 | 5.8 | 5.8 | 5.8 |
| Catechol | — | — | — | 4.0 | — | — | — |
| 3-Methyl catechol | — | — | — | — | 4.0 | — | — |
| 4-Methyl catechol | — | — | — | — | — | 4.0 | — |
| 4-t-Butl catechol | — | — | — | — | — | — | 4.0 |

NMP = N-methyl-1 pyrrolidone
EGBE = Ethylene glycol butyl ether
EG = Ethylene glycol
MPA = 3-Morpholinopropylamine
5-MBT = 5-Methylbenzotriazole
TT = Tolyltriazole
CyDTA = Trans-1,2-cyclohexanediamine tetraacetic acid
LP-300 = Dipolar pyrrolidone ring surfactant with n-dodecyl group
TEA = Triethanolamine The compatibility of the removal compositions of this invention is illustrated by the following examples. Measurements were performed after treatment of the materials in a composition of this invention from Table 1 at 65° C. for 20 minutes. A water rinse was performed after the treatment in the compositions. The thickness of the metal films (Cu, W, and TiN) was determined through the use of a 4 point probe.

65° C. during a 20 minute treatment. The copper film thickness was measured by 4-point probe method before and after treatment. The compositions were equivalent except the identity of the primary amine compound and contained 20.9% wt. H$_2$0, 20% NMP, 46.5% EGBE, 6% TEA, 1.5% of primary amine, 5% EG, and 0.1% 5-MBT. Table 3 lists etch rates for copper.

TABLE 3

| Primary Amine | Copper Etch Rate (Å/min) |
|---|---|
| MEA | 16 |
| MIPA | 5.1 |
| MPA | 0.4 |

The use of MPA affords excellent copper compatibility and provides the reactive primary amine useful in dissolving polymeric films and residue.

The uniqueness of using 5-MBT or TT in the morpholinopropylamine compositions of this invention as compared to benzotriazole (BZT) is exemplified by the following experiment. Equivalent compositions containing 20.9% wt. H2O, 20% NMP, 46.5% EGBE, 6% TEA, 1.5% of primary amine, 5% EG, and 0.1% of either 5-MBT, TT, or BZT were used to test the utility of 5-MBT, TT, or BZT. Table 4 lists the copper etch rate as a function of primary amine and corrosion inhibitor.

TABLE 4

| Primary Amine | Corrosion Inhibitor | Copper Etch Rate (Å/min) |
|---|---|---|
| MPA | 5-MBT | 0.4 |
| MIPA | 5-MBT | 5.1 |
| MEA | 5-MBT | 16 |
| MPA | BZT | 8.8 |
| MIPA | BZT | 8.3 |
| MEA | BZT | 7.3 |
| MPA | TT | 1.1 |
| MIPA | TT | 7.4 |
| MEA | TT | 22.9 |

MIPA = Mono isopropanolamine
MEA = Monoethanolamine

The unique combination of MPA and 5-MBT or TT provides excellent copper compatibility whereas the compositions with BZT or with other amines such as MIPA and MEA do not.

Deposition of benzotriazole films on copper from aqueous solutions is a relatively mature field with an extensive body of literature. Most of this literature is concerned with the use of benzotriazole and its derivatives in aqueous solutions as opposed to solvent systems. A surprising finding when developing this invention was that after a treatment of a copper sample to remove any native oxide on the surface, so to expose as close to a pristine copper surface as possible, a treatment with disclosed compositions resulted in a deposition of an insoluble film. This film (see pictures) is composed of copper ions and inhibitor molecules. This deposition can be prevented by including a metal ion chelator (CyDTA). The film will form primarily composed of $CU^{2+}$ and inhibitor. The role of the metal ion chelator is to bind the $CU^{2+}$ as a formulation soluble complex and thereby preventing the $CU^{2+}$ from complexing with inhibitor molecules as an insoluble complex.

Figure 1:
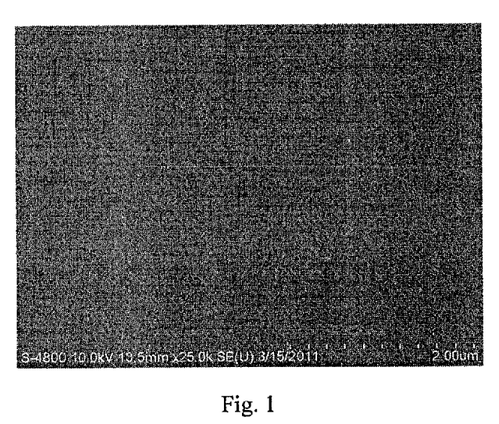
FIG. 1 is the SEM image of the untreated surface of the wafer as described in the specification as follows.
Figure 2:
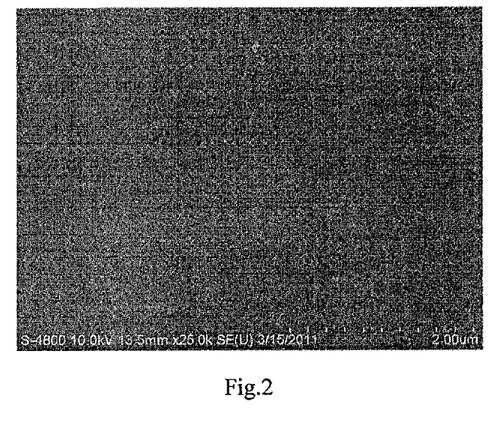
FIG. 2 is the SEM image of surface of the wafer treated with the 200:1 dHF dip as described in the specification as follows.
Figure 3:
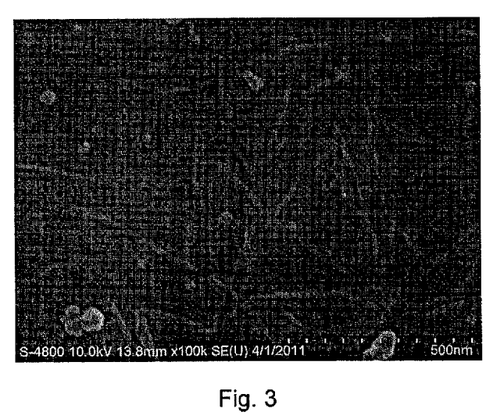
FIG. 3 is the SEM image of surface of the wafer treated with the comparative prior art composition as described in the specification as follows.
Figure 4:
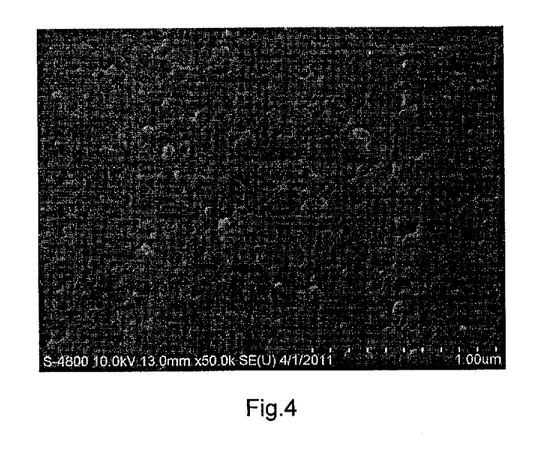
FIG. 4 is the SEM image of surface of the wafer treated with the inventive composition as described in the specification as follows.

The uniqueness and further advantage of the compositions of this invention compared to the prior art is also demonstrated by the following test. Silicon wafers with a deposited film of copper metal were treated with 200:1 dHF dip at room temperature for 30 minutes to remove any native copper oxide that had formed over time at ambient conditions. The treatment was performed in a beaker with a stir bar. Following this treatment the wafers was rinsed in water and subsequently treated in the following comparative and inventive compositions below for 30 minutes at 65° C. The wafers were then SEM imaged to determine if the insoluble film deposition had occurred. The comparative composition was the composition designated as Example 3 in US 2010/0151610 Al containing 20% water, 2% morpholinopropylamine, 2% monoethanolamine, 53% diethylene glycol monobutyl ether and 1% benzotriazole. The inventive composition was Composition 2 from Table 1 of the present application wherein the corrosion inhibitor was 5-MBT, namely the composition of 20.75% water, 20% NMP, 20% EGBE, 5% EG, 6% TEA, 1.5% MPA, 0.1% CyDTA, 0.05% LP-300 and 0.1% 5-MBT. The SEM images of the wafers resulted in the following observations. The untreated copper surface on the wafers had no polymeric film imaging on the surfaces as shown in FIG. 1. Similarly, after the wafers were treated with the 200:1 dHF dip no polymeric film was imaging on the surfaces as shown in FIG. 2. Observation of the wafer that had the native oxide removed and was then treated with the comparative prior art exemplary composition showed significant undesired polymeric film in the SEM image as shown in FIG. 3. In contradistinction, observation of the wafer that had the native oxide removed and was then treated with the inventive composition showed no polymeric film in the SEM image as shown in FIG. 4. Thus, while the prior art composition may be suitable for preventing the corrosion of Cu they cannot prevent the deposition of the insoluble film.

The desirability and advantage of the compositions of this invention containing catechol or an alkyl catechol when the composition is employed to clean a microelectronic device that has exposed aluminum is demonstrated by the following examples. Wafer pieces sized 1 inch×1 inch (2.54 cm×2.54 cm) having an exposed aluminum layer of 1600 Å thickness on a film of silicon were dipped into beakers with a stir bar (650 rpm) containing cleaning compositions of this invention. The compositions employed were Compositions 1, 4, 5, 6 and 7 of Table 1. The wafer pieces were exposed to the cleaning compositions for a period of 30 minutes at 65° C. A water rinse was performed after the treatment in the compositions. The aluminum corrosion (Al etch rate) was determined through the use of a 4 point probe. The Al etch rate results are set forth in Table 5.

TABLE 5

| Composition No. | Al etch rate Å/min |
|---|---|
| 1 | 12.0 |
| 4 | 7.1 |
| 5 | 6.4 |
| 6 | 2.7 |
| 7 | 0.8 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A removal composition for removing post etch treatment (PET) polymeric film from a microelectronic device, the composition consisting essentially of: (a) from about 5% to about 49% by weight of water; (b) from about 2% to about 20% by weight of ethylene glycol; (c) from about 30% to about 70% by weight of one or more glycol ether solvent; (d) from about 0.5% to about 20% by weight of morpholinopropylamine; (e) from about 0.1% to about 0.5% by weight of a corrosion inhibitor compound selected from the group consisting of methylbenzotriazole and tolyltriazole; and optionally one or more of the following components: (f) one or more metal ion chelating agent in an amount of from about 0.01% to about 1% by weight when present in the composition; (g) one or more other polar organic solvent in an amount of from about 0.5% to about 40% by weight when present in the composition; (h) one or more tertiary amine in an amount of from about 2% to about 12% by weight when present in the composition; (i) one or more of catechol or an alkyl catechol in an amount of from about 0.01% to 10% by weight when present in the composition; and (j) one or more surfactant in an amount of from about 0.01% to about 1% by weight when present in the composition.

2. A removal composition according to claim 1 wherein the composition contain 5-methylbenzotriazole and 3-morpholinopropylamine and ethylene glycol butyl ether.

3. A removal composition of claim 1 wherein the composition contains a tertiary amine.

4. A removal composition of claim 3 wherein said tertiary amine is triethanolamine.

5. A removal composition of claim 3 wherein the composition contains a metal ion chelating agent.

6. A removal composition of claim 5 wherein said is trans-1,2-cyclohexanediamine tetraacetic acid.

7. A removal composition of claim 5 wherein the composition contains another polar organic solvent.

8. A removal composition of claim 7 wherein said polar organic solvent is N-methyl pyrrolidone.

9. A removal composition of claim 1 wherein the composition contains catechol or an alkyl catechol.

10. A removal composition according to claim 9 wherein the composition contains 4-t-butylcatechol.

11. A removal composition of claim 1 comprising about 20.9% water, about 20% N-methyl pyrrolidone, about 46.5% ethylene glycol butyl ether, about 5% ethylene glycol, about 6% triethanolamine, about 1.5% morpholinopropylamine, and about 0.1% methylbenzotriazole.

12. A removal composition of claim 1 comprising about 20.75% water, about 20% N-methyl pyrrolidone, about 46.5% ethylene glycol butyl ether, about 5% ethylene glycol, about 6% triethanolamine, about 1.5% morpholinopropylamine, about 0.1% trans-1,2-cyclohexanediamine tetraacetic acid, about 0.05% dipolar pyrrolidone ring surfactant with n-dodecyl group and about 0.1% methylbenzotriazole.

13. A removal composition of claim 1 comprising about 19.95% water, about 60.7% ethylene glycol butyl ether, about 10% ethylene glycol, about 9% morpholinopropylamine, about 0.1% trans-1,2-cyclohexanediaminetetraacetic acid, about 0.05% dipolar pyrrolidone ring surfactant with n-dodecyl group and about 0.2% methylbenzotriazole.

14. A removal composition of claim 1 comprising about 20.0% water, about 19.2% n-methylpyrrolidinone, about 44.7% ethylene glycol butyl ether, about 4.8% ethylene glycol, about 1.4% morpholinopropylamine, about 0.1% methylbenzotriazole and about 4% of an aluminum corrosion inhibitor selected from catechol and an alkyl catechol.

15. A process for removing post etch treatment (PET) polymeric film from a microelectronic device, the process comprising contacting the microelectronic device with a composition of claim 1 for a time and at a temperature effective to remove the post etch treatment (PET) polymeric film from the microelectronic device.

16. A process for removing post etch treatment (PET) polymeric film from a microelectronic device, the process comprising contacting the microelectronic device with a composition of claim 2 for a time and at a temperature effective to remove the post etch treatment (PET) polymeric film from the microelectronic device.

17. A process for removing post etch treatment (PET) polymeric film from a microelectronic device, the process comprising contacting the microelectronic device with a composition of claim 3 for a time and at a temperature effective to remove the post etch treatment (PET) polymeric film from the microelectronic device.

18. A process for removing post etch treatment (PET) polymeric film from a microelectronic device, the process comprising contacting the microelectronic device with a composition of claim 4 for a time and at a temperature effective to remove the post etch treatment (PET) polymeric film from the microelectronic device.

19. A process for removing post etch treatment (PET) polymeric film from a microelectronic device, the process comprising contacting the microelectronic device with a composition of claim 5 for a time and at a temperature effective to remove the post etch treatment (PET) polymeric film from the microelectronic device.

20. A process for removing post etch treatment (PET) polymeric film from a microelectronic device, the process comprising contacting the microelectronic device with a composition of claim 6 for a time and at a temperature effective to remove the post etch treatment (PET) polymeric film from the microelectronic device.

21. A process for removing post etch treatment (PET) polymeric film from a microelectronic device, the process comprising contacting the microelectronic device with a composition of claim 7 for a time and at a temperature effective to remove the post etch treatment (PET) polymeric film from the microelectronic device.

22. A process for removing post etch treatment (PET) polymeric film from a microelectronic device, the process comprising contacting the microelectronic device with a composition of claim 8 for a time and at a temperature effective to remove the post etch treatment (PET) polymeric film from the microelectronic device.

23. A process for removing post etch treatment (PET) polymeric film from a microelectronic device, the process comprising contacting the microelectronic device with a composition of claim 9 for a time and at a temperature effective to remove the post etch treatment (PET) polymeric film from the microelectronic device.

24. A process for removing post etch treatment (PET) polymeric film from a microelectronic device, the process comprising contacting the microelectronic device with a composition of claim 10 for a time and at a temperature effective to remove the post etch treatment (PET) polymeric film from the microelectronic device.

25. A process for removing post etch treatment (PET) polymeric film from a microelectronic device, the process comprising contacting the microelectronic device with a composition of claim 11 for a time and at a temperature effective to remove the post etch treatment (PET) polymeric film from the microelectronic device.

26. A process for removing post etch treatment (PET) polymeric film from a microelectronic device, the process comprising contacting the microelectronic device with a composition of claim 12 for a time and at a temperature effective to remove the post etch treatment (PET) polymeric film from the microelectronic device.

27. A process for removing post etch treatment (PET) polymeric film from a microelectronic device, the process comprising contacting the microelectronic device with a composition of claim 13 for a time and at a temperature effective to remove the post etch treatment (PET) polymeric film from the microelectronic device.

28. A process for removing post etch treatment (PET) polymeric film from a microelectronic device, the process comprising contacting the microelectronic device with a composition of claim 14 for a time and at a temperature effective to remove the post etch treatment (PET) polymeric film from the microelectronic device.

29. A process according to claim 15 wherein the microelectronic device has a low-κ dielectric.

* * * * *